United States Patent [19]

Cave et al.

[11] 4,027,271

[45] May 31, 1977

[54] CAPACITOR STRUCTURE AND CIRCUIT FACILITATING INCREASED FREQUENCY STABILITY OF INTEGRATED CIRCUITS

[75] Inventors: David L. Cave, Mesa; Walter R. Davis, Tempe, both of Ariz.

[73] Assignee: Motorola, Inc., Chicago, Ill.

[22] Filed: Nov. 6, 1975

[21] Appl. No.: 629,728

Related U.S. Application Data

[62] Division of Ser. No. 430,267, Jan. 2, 1974, Pat. No. 3,953,875.

[52] U.S. Cl. .................. 330/22; 307/109; 330/38 M; 330/40; 333/80 T
[51] Int. Cl.² .......................................... H03F 3/04
[58] Field of Search ............... 307/109; 330/19, 22, 330/38 M, 40; 333/80 T

[56] References Cited

UNITED STATES PATENTS

| | | | |
|---|---|---|---|
| 3,553,609 | 1/1971 | Edge | 333/80 T |
| 3,702,405 | 11/1972 | Zwirn | 333/80 T X |

Primary Examiner—Rudolph V. Rolinec
Assistant Examiner—Lawrence J. Dahl
Attorney, Agent, or Firm—Michael D. Bingham

[57] ABSTRACT

A stabilizing circuit which increases the effective value of a capacitor and the structure of a monolithic capacitor are disclosed. The stabilizing circuit includes a transistor having a base electrode connected to the capacitor and an emitter electrode connected to a point at which it is desired to provide an increased effective capacitance. The capacitor structure is suitable for being included in monolithic integrated circuits having diffused isolation regions. A first plate of the capacitor is formed by a metallization layer, the second plate of the capacitor may be formed by an emitter diffusion into the isolation diffusion. A base diffusion which is conductively connected to the emitter diffusion and to the isolation diffusion facilitates connection of the second plate of the capacitor to the substrate.

8 Claims, 2 Drawing Figures

CAPACITOR STRUCTURE AND CIRCUIT FACILITATING INCREASED FREQUENCY STABILITY OF INTEGRATED CIRCUITS

This is a division of application Ser. No. 430,267, filed Jan. 2, 1974, now U.S. Pat. No. 3,953,875, issued Apr. 17, 1976.

BACKGROUND OF THE INVENTION

Monolithic circuits such as are used in power amplifiers sometimes require NPN and PNP bipolar transistors. The transistors of monolithic integrated circuits are usually fabricated in N-type epitaxial (epi) silicon located on a P-type silicon substrate. Vertical NPN transistors can be readily fabricated by using a P-type base diffusion into the N-type epi and an N-type emitter diffusion into the P-type base. The N-type epi provides the collector electrode of such NPN transistors. The substrate is not used in NPN transistor structures other than for isolation functions. A P+ isolation diffusion generally surrounds each of the NPN transistors and provides isolation.

PNP transistors, which are most difficult to fabricate in the N-type epi, usually have either lateral or vertical structures. Vertical, substrate PNP transistors include collector electrodes formed of the P-type substrate material and base electrodes formed of the N-type epi. The P diffusion, which forms the base electrodes of NPN transistors, provides the emitter electrodes of the substrate PNPs. Hence, the collector material of the NPNs forms the base of the substrate PNPs and the base diffusion for the NPN forms the emitter electrode of substrate PNPs. Since the collector of a substrate PNP is the substrate itself, the collector cannot be loaded and must be connected to the negative supply. Hence, such transistors can only be used in an "emitter-follower-mode."

Substrate Darlingtons include a driver transistor and an output transistor. The driver transistor has an emitter electrode connected to the base electrode of the output transistor and a collector electrode connected to the negative supply conductor. The base electrode of the driver transistor is connected to the Darlington input or driving terminal. The emitter electrode of the output transistor is connected to the output terminal of the Darlington and the collector electrode of the output transistor is connected to the negative supply conductor.

The common emitter current-gain-bandwidth product ($f_T$) of substrate PNP monolithic integrated circuit transistors is typically low, for instance, on the order of from 3 to 30 megacycles. Consequently, problems occur when attempts are made to use these transistors in Darlington configurations for conducting large currents through load impedances having capacitive reactances. If a purely capacitive load is connected to the output terminal of a substrate PNP Darlington follower, the reactance of the capacitive load tends to be transformed into a negative resistance at the input terminal of the Darlington. This negative resistance apparently tends to cause oscillation.

Moreover, if a load resistance is added in parallel with the load capacitance, then the impedance looking into the input terminal of the Darlington substrate PNP transistors is changed from a negative resistance to an inductive reactance. This inductance in combination with stray circuit capacitance at the input terminal of the Darlington, which could be provided by the collectors, apparently creates a resonant circuit. Positive feedback through the resonant circuit also apparently results in undesirable oscillation.

One prior art solution for reducing the instability problem is to increse the base resistance or the output substrate Darlington PNP. This can be accomplished by utilizing a resistor to connect the emitter electrode of the driver transistor to the base electrode of the output transistor. This resistor must have a large value such as on the order of 10 kilo-ohms. The base current of the output transistor must flow through this large resistor. Since the beta of a PNP substrate transistor is relatively low, for instance 20, the PNP substrate output transistor requires high magnitude base currents to facilitate high magnitude load currents. Such base currents develop large voltage drops across the base resistor. Consequently, the load voltage cannot be driven to the negative supply potential because of the potential drop developed across the base resistor, which is in series with the load.

Another solution to the instability problem requires that a capacitor be connected between the input terminal of the Darlington and the ground or low level supply conductor. If this capacitor has a large value, on the order of 300 picofarads (pf), its reactance apparently swamps out the undesired impedance reflected from the load to the input terminal of the Darlington. The disadvantage of this technique is the fact that the capacitor takes up a large amount of die area, if provided on the chip. Integrated circuit capacitors have capacitances of about 0.1 picofarad per square mil (thousandth of an inch). Hence, a 300 picofarad capacitor requires about 3,000 square mils of die area, which is an undesirably large amount of die area. If the capacitor is located off of the chip then package leads are required to make connection thereto. Hence, external capacitors either increase the cost of the integrated circuit by requiring it to have additional leads or limit the electrical functions it can perform by using leads required for such functions. Moreover, to increase marketability, it is desirable to reduce the number of external components required for use with integrated circuits.

SUMMARY OF THE INVENTION

One object of this invention is to provide an improved amplifier circuit.

Another object of this invention is to provide an improved monolithic integrated amplifier circuit including a PNP Darlington pair.

Still another object of this invention is to provide a capacitor structure for use in monolithic integrated circuits having isolation diffusions and which takes up a minimum amount of space.

A further object of the invention is to provide an integrated circuit configuration which increases the effective capacitance of a small capacitor above its actual capacitance value.

A still further object of the invention is to provide a technique for increasing the effective capacitance of a small capacitor to stabilize an otherwise unstable circuit.

The invention relates to a stabilizing circuit which increases the effective value of a capacitor and to the structure of the capacitor. The stabilizing circuit can include a transistor having a base electrode connected to the capacitor and an emitter electrode connected to the point at which it is desired to provide an increased effective capacitance. In one embodiment, the transistor is part of a bias network. The point or circuit node at which the increased capacitance is desired may be the base electrode of the input transistor of a PNP substrate Darlington follower circuit, which includes input and output transistors.

The capacitor structure has a conductor formed by a first region of a first conductivity type semiconductor material which includes an isolation region and a portion formed by a base diffusion utilized in the making of NPN transistors. A second region of a second conductivity type semiconductor material is integral with the first region and provides one plate of the capacitor. This second region may be formed by an emitter diffusion utilized in the making of NPN transistors. A layer of silicon dioxide overlies the second region and provides the dielectric of the capacitor. A layer of metallization over the silicon dioxide provides the other plate of the capacitor, which may be connected to the base electrode of the first transistor. The isolation region connects the second region or plate to the substrate, which provides further connection to the ground or negative power supply terminal.

DETAILED DESCRIPTION OF THE PREFERRED EMBODIMENT

Figure 1:
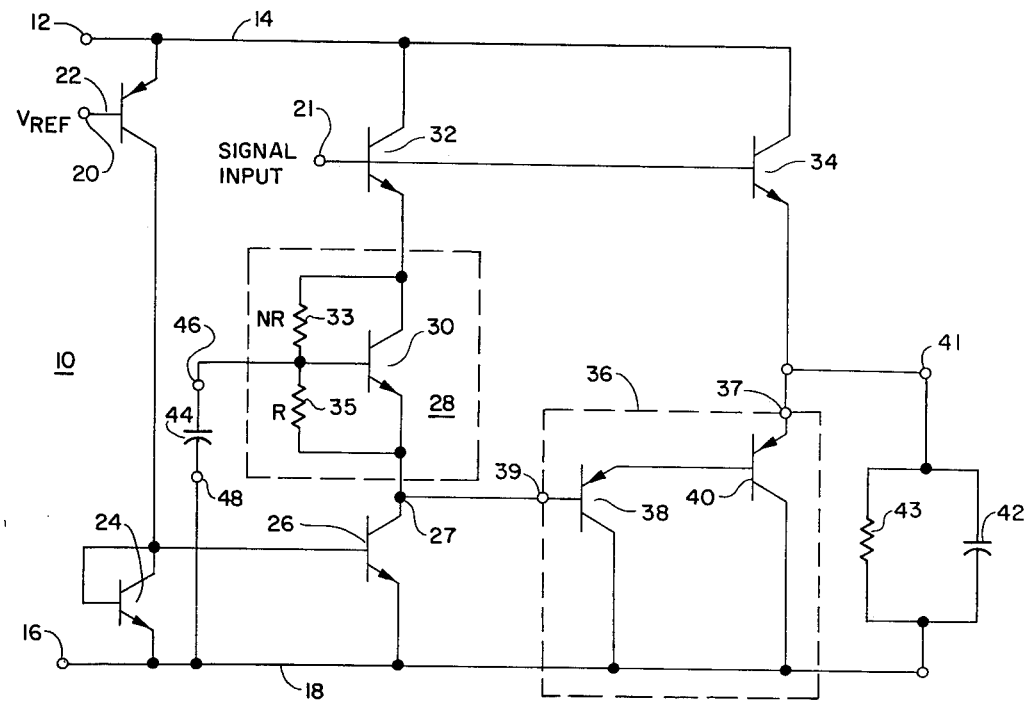
FIG. 1 is a schematic diagram of an amplifier circuit included in a monolithic integrated circuit utilizing a frequency stabilizing circuit which can include the capacitor structure of one embodiment of the invention.

FIG. 1 is a schematic diagram of an amplifier circuit which illustrates one manner in which the subject invention can be employed. More specifically, amplifier circuit 10 of FIG. 1 includes a positive power supply terminal 12, which is connected to conductor 14, nd a negative power supply terminal 16, which is connected to negative power supply conductor 18. Voltage reference ($V_{ref}$) terminal 20 is adapted to receive a potential which is intermediate between the potentials applied to power supply terminals 12 and 16. The voltage reference can be provided by any one of a plurality of known circuits. Input terminal 21 is adapted to receive an input signal which may be a sinusoidal signal having an audio frequency.

Transistor 22 includes an emitter electrode which is connected to power supply conductor 14 and a base electrode which is connected to voltage reference terminal 20. Diode connected transistor 24 includes an emitter electrode connected to conductor 18, and base and collector electrodes which are connected to each other in a known manner to form a diode. The collector and base electrodes of transistor 24 are connected to the collector electrode of transistor 22. Transistor 26 includes an emitter electrode connected to conductor 18 and a base electrode connected to transistor 24.

Bias network 28 includes transistor 30, resistor 33 and resistor 35. Resistor 33 is connected from the collector electrode to the base electrode of transistor 30 and resistor 35 is connected from the base electrode to the emitter electrode of transistor 30. The collector electrode of transistor 30 is connected to the emitter electrode of signal amplifier transistor 32, which has a collector electrode connected to conductor 14. The base electrode of transistor 32 is connected to input terminal 21 and to the base electrode of NPN output transistor 34. The emitter electrode of transistor 34 is connected to output terminal 41.

Terminal 37 of PNP Darlington 36, which includes PNP substrate transistors 38 and 40, is also connected to output terminal 41. The base electrode of input transistor 38 is connected through terminal 39 to collector electrode 27 of transistor 26. The collector electrodes of transistors 38 and 40 are connected to power supply conductor 18 and the emitter electrode of transistor 38 is connected to the base electrode of transistor 40. The emitter electrode of transistor 40 is connected to terminal 37.

In operation, transistor 22 provides current through diode 24 which renders source transistor 26 conductive. The base electrode of transistor 32 is biased by the signal driving circuit (not shown) so that transistor 32 operates Class A. Thus, a constant current flows through "N$\phi$" bias network 28. The base-to-emitter voltage of transistor 32 and the voltage across "N$\phi$" network 28 provides bias to NPN driver transistor 34 and to PNP Darlington pair 36.

The positive excursions of an a.c. (alternating current) input signal tend to add up to the positive bias supplied by "N$\phi$" network 28 to forward bias transistor 34, so that more current is supplied from power supply conductor 14 through output terminal 41 and to a load which can include a resistive component 43 and a capacitive component 42. Alternatively, the negative excursions of the a.c. input signal render Darlington 36 more conductive and transistor 34 less conductive, so that the voltage at output terminal 41 tends to decrease in magnitude thereby providing a decrease in the instantaneous magnitude of the voltage across and the current through the electrical load.

THE FREQUENCY INSTABILITY PROBLEM

Without capacitor 44 connected, the circuit functions properly under purely resistive load conditions. However, under purely capacitive load conditions, wherein only capacitor 42 is connected from terminal 41 to the negative supply conductor 18, frequency instability problems occur. More specifically, as the amplifier input signal current at terminal 21 changes, the current in the substrate PNPs of Darlington 36 increase and decrease, which changes the $f$ of the PNPs. Under some bias conditions, the impedance looking into the base electrode of PNP transistor 38 apparently becomes a negative resistance. This condition in cooperation with other impedances at terminal or node 39 apparently produce an undesirable oscillating output signal across the electrical load. Circuit 10 then operates as an oscillator rather than as an amplifier. If the electrical load includes both capacitor 42 and resistor 43, oscillation can also occur as the amplifier input signal directs the amplifier to change the load current, the $f_r$ of PNP Darlington transistors will again change. As a result, the impedance looking into base electrode 39 of substrate PNP 38, which is reflected from the resistive-capacitive load, begins to appear as inductive reactance. The capacitance at node 39, which is created by the collector capacitance of transistor 26 and other capacitive effects, apparently combine with the inductance to provide a resonant circuit. The loop including transistors 26, 30, 32, 34 and Darlington 36 oscillates apparently because of feedback through the resonant circuit.

SOLUTION OF INSTABILITY PROBLEM

One prior art method of curing the oscillation problem is to connect a large capacitance between node 39 and a.c. ground, which would "swamp out" or render the impedance reflected through Darlington 36 incapable of producing oscillation. The required capacitance may be on the order of 300 picofarads, which with present day monolithic processes, would require a large area on the order of 3,000 square mils, if included on the same integrated circuit structure as amplifier 10.

Circuit 10 does not require that a large capacitor be connected to terminal 39. More specifically, capacitor 44 has one terminal 46 connected to the base electrode of NPN transistor 30 and another terminal 48 which is connected to a low a.c. impedance point, which can be negative supply conductor 18. Terminal 48 could also be connected to positive power supply conductor 14. Transistor 30 in effect multiplies the actual capacitance of capacitor 44 to provide an increased effective capacitance at terminal 39, which is equal to the beta of transistor 30 times the capacitance of capacitor 44. Hence, if a capacitance of 300 picofarads is necessary at terminal 39 to stabilize circuit 10, then a capacitor connected to the base of transistor 30 having a capacitance of 300 picofarads divided by the beta of transistor 30 is adequate. Since standard processes give transistor 30 a beta of 100, a three picofarad capacitor connected between the base of transistor 30 and supply conductor 18 provides 300 picofarads between terminal 39 and conductor 18. Therefore, instead of requiring about 3,000 square mils of die area, capacitor 44 requires only about 30 square mils of die area.

STRUCTURE OF THE CAPACITOR

Figure 2:
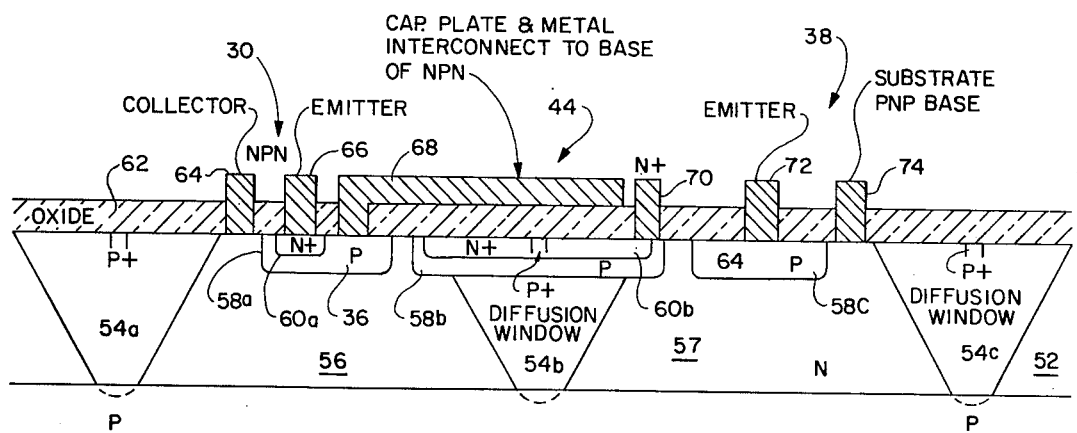
FIG. 2 is a cross sectional view of a semiconductor die illustrating one embodiment of the capacitor structure.

As shown by the cross sectional view of FIG. 2, the structure includes a P-type substrate 50 which has a layer of N-type epitaxial semiconductor material 52 provided thereon. A layer of silicon dioxide 62 is grown on the outwardly facing surface of epitaxial material 52. Photolithographic techniques are utilized to selectively open windows in the silicon dioxide layer through which a P+ diffusion provides isolation regions 54a, 54b and 54c, which extend from the top surface of epitaxial material 52 into substrate material 50. N-type epitaxial islands 56 and 57 are surrounded by P+ isolation diffusions 54 and P-type substrate 50. Next, silicon dioxide is grown in the openings through which isolation diffusions 54a, 54b, and 54c were provided. The silicon dioxide layer is again selectively masked by photolithographic processes and etched to provide openings through which a base diffusion provides region 58a, which is the base electrode of NPN transistor 30, 58b, which is integral with isolation region 54b, and region 58c, which forms the emitter region for PNP substrate transistor 38. Another diffusion forms region 60a, which is the emitter of NPN transistor 30, region 60b and collector contacts within the semiconductor material (not shown).

Next, oxide layer 62 is grown over the surface of the resulting semiconductor structure and openings are again selectively provided therein. Then, a layer of metallization is applied and selectively patterned to provide collector contact 64, emitter contacts 66 and 72, base contacts 68 and 74 and shorting contact 70. Base contact 68 also extends over silicon dioxide layer 62 and overlays N+ region 60b to form the plate of capacitor 44, which is connected to the base of transistor 30. Metallization 70 shorts N+ region 60b to P region 58b to remove the rectifying effect which otherwise could occur therebetween, and to decrease the series resistance of capacitor 44. Metallization 72 provides electrical connection to the emitter of PNP transistor 38 and metallization 74 provides contact to the base of transistor 38.

Isolation diffusions 54a, 54b and 54c may be formed through diffusion windows in the silicon dioxide having a width on the order of four-tenths of a mil (thousandth of an inch). As shown in FIG. 2, the P+ isolation diffusion tends to diffuse in a lateral direction at about the same rate that it diffuses in the vertical direction. Thus, if epitaxial layer 52 has a depth on the order of 16 microns, then the out diffusion of the P+ isolation region will be on the order of 16 microns. The isolation diffusions, therefore, take up much of the surface area of the semiconductor die. The structure of capacitor 44, which overlies isolation diffusion 54b, does not substantially increase the required surface area because it utilizes surface area otherwise taken up by isolation diffusion 54b, which separates two active devices, such as transistor 30 and transistor 38. The isolation diffusion generally forms the anode of a reversed bias diode structure, which electrically isolates the devices of the integrated circuit from each other.

What has been described, therefore, is an improved monolithic integrated amplifier circuit including a PNP Darlington pair. The integrated circuit further includes a capacitor structure which takes up a minimum amount of space and which has a capacitive value that is beta multiplied to have an effective value capable of stabilizing a pair of PNP substrate Darlington transistors. Since the capacitor structure overlies an otherwise necessary P+ type isolation diffusion, the capacitor structure takes up virtually no additional surface area on the integrated circuit chip. Therefore, more integrated circuits can be provided per wafer than if other types of capacitor structures were utilized. Hence, the disclosed capacitor structure serves to increase the yield and decrease the cost of integrated circuits. Hence, the improved capacitor structure and beta multiplying technique tend to make PNP substrate Darlington configurations useable in circuits where they were previously impractical because of the large size taken up by a required frequency stabilizing capacitor.

It is contemplated that after having read the above description of the preferred embodiments, those skilled in the art will foresee certain alterations and modifications which have not been pointed out with particularity herein. Accordingly, this disclosure is intended as being in the nature of an explanatory illustration only and it is in no way to be considered as limiting. Therefore, the appended claims are to be interpreted as covering all modifications which fall within the true spirit and scope of the invention. More specifically, although the capacitor structure has been described with respect to a particular monolithic amplifier configuration, it could also be used in other monolithic configurations. Likewise, although the beta multiplication of the effective value of the capacitor has been described along with a specific capacitor structure, the effective capacitance multiplication effect can also be used in other applications not involving the described capacitor structure.

We claim:

1. In a monolithic integrated amplifier including an input section adapted to receive an input signal, an output section for developing an output signal across a load impedance connected thereto, the output section having a first input node at which the value of impedance developed thereat is dependent on the load impedance, a frequency stabilization circuit for preventing the impedance developed at the input node from reaching a value that would otherwise cause the amplifier to oscillate, comprising in combination;

bias network means interposed between the input section and the input node of the output section and including first electron control means having first, second and control electrodes, said first electrode being connected to the input node, said second electrode being connected to an output node of the input section, and resistive divider means coupled across said first and second electrodes and to said control electrode of said first electron control means, said first electron control means having a predetermined current amplification factor; and capacitive means adapted to be coupled between said control electrode of said first electron control means and an alternating current ground potential of the amplifier circuit, the value of the impedance of said capacitive means being effectively multiplied by said current amplification factor of said first electron control means such that the effective impedance provided at the input node of the output section by said bias network means sufficiently prevents the undesirous oscillations.

2. The combination of claim 1 wherein said capacitive means is integral with a monolithic integrated circuit structure having a substrate, the capacitive means including:
   a layer of metallization forming said second plate of said capacitor and having first and second surfaces;
   a layer of dielectric material having a first surface adjacent to said second surface of said layer of metallization and a second surface;
   a first region of semiconductor material of a first conductivity type having a first surface adjacent said second surface of said dielectric material, said first region forming said first plate of the capacitor; and
   a second region of semiconductor material having a second conductivity type and a first surface adjacent to said second surface of said first region of semiconductor material, said second region of semiconductor material extending from said first region of semiconductor material to the substrate.

3. The combination of claim 2 further including a second layer of metallization forming a connection between said first region of semiconductor material and said second region of semiconductor material.

4. The combination of claim 3 wherein said second region of semiconductor material includes:
   a first portion which is provided by an isolation diffusion; and
   a second portion which is integral with said first portion and with said first region, said second portion being provided by a base diffusion.

5. The combination of claim 1 further including second electron control means having a first electrode connected to a first power supply conductor, a control electrode adapted to receive a bias voltage having a constant magnitude and a second electrode connected to the first input node of the output section.

6. The combination of claim 1 further including:
   second electron control means having a first electrode adapted to be connected to a first power supply conductor, a control electrode adapted to receive a bias voltage having a constant magnitude, and a second electrode connected to the first input node of the output section of the monolithic amplifier circuit;
   the output section of the monolithic amplifier circuit having a second input node; and
   the input section including a third electron control means having a control electrode adapted to receive the input signal which is to be amplified, a first electrode being the output node of the input section, and a second electrode connected to a second power supply conductor; and
   first circuit means coupling said control electrode of said third electron control means to said second input node of said output section.

7. The combination of claim 6 wherein the output section of the monolithic amplifier circuit further includes:
   fourth electron control means having a control electrode connected to said input node of the output section of the monolithic amplifier circuit, a first electrode connected to the output terminal of the output section, and a second electrode connected to said second power supply conductor; and
   fifth electron control means having a control electrode connected to the first input node of the output of the monolithic amplifier circuit, a first electrode connected to the output terminal of the output section of the monolithic amplifier circuit, and a second electrode connected to said first power supply conductor.

8. The combination of claim 7 wherein said fifth electron control means includes a PNP Darlington amplifier circuit.

* * * * *